SEMICONDUCTORS HAVING SELECTIVELY FORMED CONDUCTIVE OR METALLIC PORTIONS AND METHODS OF MAKING SAME
Filed Feb. 26, 1965

INVENTOR
ROLF R. HABERECHT
THOMAS H. RAMSEY, JR.
William D. Harris, Jr.
ATTORNEY United States Patent Office
3,501,342
Patented Mar. 17, 1970

3,501,342

SEMICONDUCTORS HAVING SELECTIVELY FORMED CONDUCTIVE OR METALLIC PORTIONS AND METHODS OF MAKING SAME

Rolf R. Haberecht, Richardson, and Thomas H. Ramsey, Jr., Dallas, Tex., assignors to Texas Instruments Incorporated, Dallas, Tex., a corporation of Delaware Filed Feb. 26, 1965, Ser. No. 436,421
Int. Cl. B44d 1/18
U.S. Cl. 117—212 24 Claims

ABSTRACT OF THE DISCLOSURE

Disclosed is a process for preparing a comparatively planar, conductive zone on an exposed surface of a semiconductor body made of a semiconductor compound composed of at least two elements by removing constituent from the compound in the zone. Removal of the constituent from the zone may be accomplished, at least in part, by exposing the zone to localized concentration of energy such as produced, for example, by an electron beam. Disclosed also are articles made by the foregoing process, which articles may include a semiconductor body having conductive paths thereon, with resistors and/or capacitors autogenously formed on the body and interconnected by the conductive paths.

This invention relates to semiconductors having selectively formed conductive or metallic portions and methods of making same. More specifically it relates to semi-conductor compound bodies having such conductive or metallic portions and methods of making such bodies.

In solid circuits, it is frequently desirable to provide conductive paths for a semiconductor body. Such paths may be used, for example, to provide circuit interconnection with various regions of a transistor or other component formed in the semiconductor body. In many instances it is desirable to provide highly miniaturized contacts, essentially ohmic in nature, for various regions in a semiconductor body. Moreover, it is desirable to provide passive components, e.g. resistors, for various circuit applications. However, prior art technology does not provide for such paths, contacts, and components in a truly satisfactory manner. Thus, metal is now typically deposited (as by vapor phase deposition) in preselected regions on a semiconductor body. The resulting bond between the metal and the semiconductor leaves much to be desired. Moreover, metallic conductive paths and contacts formed by such approach are hard to control to desired dimensions and are not capable of being simply applied to provide highly miniaturized, intricate, conductive, or circuit patterns or contacts having quite narrow dimensions.

Another problem of the prior art has been lack of a means to simply but effectively tightly bond a metal to a semiconductor body so that the resulting joint has a quite high structural strength over a wide degree of temperature variation.

It is an object of the present invention to overcome the problems of the prior art referred to above. More specifically, it is an object to provide a semiconductor body having tightly adhered, relatively conductive or metallic portions which may be configured in desired patterns on the body to provide a circuit path, including conductive paths, miniaturized contacts, and/or passive components.

An additonal object is to provide means to join metal to a semiconductor body to produce a bond having high structural integrity over a wide range of temperatures.

A further object is to provide contacts for a semiconductor body which are essentially ohmic in nature and may be made quite small and yet may be precisely positioned on the body.

A further object is to provide a semiconductor body carrying circuit paths and components which may be of intricate pattern and extremely small.

Yet a further object is to provide relatively simple methods for achieving the foregoing objects, including methods suitable for mass production technique by highly automized procedures.

In accordance with the present invention, a body is provided which comprises a semiconductor portion made of a semiconductor compound composed of at least two elements and having a comparatively conductive zone integral with and autogenously formed from said semiconductor portion.

In a preferred embodiment, the present invention provides a body comprising a semiconductor portion having a circuit path integral therewith and, at least in part, autogenously formed from said body. The body is preferably made of a semiconductor compound listed in the preceding paragraph. Metal is preferably plated over at least part of the autogenously formed portions of the circuit path.

One aspect of the present invention includes a body comprising a semiconductor portion having passive components, e.g. resistors and capacitors, integral with and at least in part autogenously formed from the semiconductor portion.

The method of the present invention includes the process for preparing a comparatively conductive portion on a semiconductor body of a compound composed of at least two chemical elements. The process involves the essential step of selectively altering the chemical structure of the compound in preselected regions. Preferably, a localized energy source is used to alter the structure by removal of one of the more volatile constituents of the compound's structure to introduce a defect in the inital compound structure in preselected regions, in accordance with a predetermined pattern. By this procedure, comparatively conductive paths and passive components may be formed.

A preferred embodiment utilizes an electron beam for a concentrated energy source.

In some instances, metal is adhered to the regions where the initial semiconductor compound structure has been altered. The adherence of metal is preferably accomplished by electroless plating.

An aspect of the present invention involves bonding a metal, as by plating or fusion, to a comparatively metallic region or zone formed in a semiconductor. The region or zone is formed by exposing the semiconductor to an energy source under suitable environmental conditions, for example, by exposure to an electron beam. The energy source is preferably concentrated.

For a more complete understanding of the present invention and for further objects and advantages thereof, reference may now be had to the following description taken in conjunction with the accompanying drawings in which.

Figure 1:
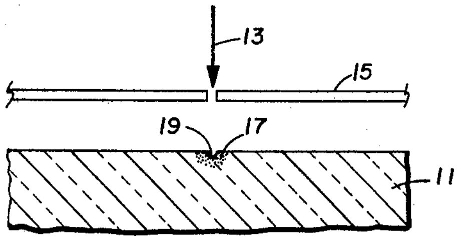
FIGURE 1 is a schematic sectional fragmentary elevational view illustrating a semiconductor body having a comparatively conductive portion being formed thereon.

Referring now to FIGURE 1, the semiconductor body 11 is illustrated therein during the process of formation of a relatively metallic or conductive circuit portion thereon by means of an electron beam, or other concentrated energy source, indicated schematically at arrowhead 13. The electron beam 13 directs energy on the surface of the semiconductor body through a narrow slot in a mask 15 to bombard the substrate therebelow at predetermined locations on the body or substrate to selectively alter the chemical structure of the body in desired zones to make those zones comparatively metallic or conductive. The zone 17 of FIGURE 1 is schematically exemplary of such a resulting zone of altered chemical structure in the body 11. In general, if exposure is sufficient, a small depression or channel will result in the region of the body where bombardment by the electron beam occurs. Such a channel 19 is schematically illustrated in FIGURE 1. The zone or region of altered chemical structure 17 bounds this channel and extends inwardly a small distance into the body. The depth of the channel 19 may be varied by variation of beam intensity and/or degree of exposure of the body 11 thereto; likewise, considerable variation may be achieved in the depth of altered zone 17 by varying beam intensity and/or exposure. When the degree of exposure and/or beam intensity is comparatively slight, little or no depression or channel forms in the body; nevertheless, chemical structural alteration results in the regions which have been bombarded by the beam.

By the foregoing technique, a desired pattern can be directly produced in a semiconductor body. The semiconductor body is changed in structure only in the localized vicinity of those immediate areas which the beam contacts. This permits paths of altered chemical structure, comparatively metallic or conductive, to be formed in accordance with a desired circuit pattern by a simple one-step operation on the semiconductor body.

A preferred technique omits the mask 15 of FIGURE 1, utilizing an electron beam spaced from the semiconductor body by a short distance such that optimum beam resolution is obtained. Highly localized selective chemical reaction, characterized by the removal of certain constituents from the initial chemical structure, is accomplished where the beam strikes the semiconductor body and it is merely necessary to move the beam about over the face of the body in any desired pattern in order to accomplish selective alteration of structure in localized, preselected regions to form a complete circuit "drawing," or to form a contact region of desired configuration.

The regions of selectively altered chemical structure, such as the zone 17 of FIGURE 1, are made comparatively more metallic and conductive in nature by the chemical change produced by the concentrated energy source-reaction environment to which they were exposed. It would appear that this is accomplished by the selective removal of constituents from the semiconductor compound structure of the body to vary that structure from the stoichiometric and change it to a structure relatively more conductive and metallic in nature. For example, the chemical structure of stoichiometric gallium arsenide is selectively altered in localized zones or regions by bombardment with an electron beam to cause the structure in those zones or regions to be relatively gallium rich. The resulting zone or region is comparatively conductive and metallic in nature. In some instances, the conditions of exposure of a body being treated by the localized, concentrated energy source may be made quite severe to cause a substantial alteration in the structure in the localized zones in the regions of exposure. Thus, in gallium arsenide, a thin surface contiguous layer may be formed in which the structure has broken down to provide a certain amount of elemental gallium, which overlies a defect region containing defect structure, not completely broken down, but not precisely of stoichiometric formula structure. Such a defect region appears in many instances to be graded ranging from a position where the defect structure is considerable to a position where it is quite minor. The relatively more conductive and metallic high defect structure portions are those which received the highest degree of beam or other concentrated energy source exposure.

When highly conductive paths are desired, the selectively altered zones or regions may be plated with a metal by an electroless plating technique. It is found that such plating occurs preferentially on the selectively altered zones when a body having such zones is immersed in an electroless plating bath. Nickel, copper, cobalt, and a variety of other metals may be plated on the selectively altered zones by such plating technique. While electroless plating solutions and techniques are well-known, the following solution and technique is given as an example: The initial solution contains 3% $NiCl_2 \cdot 6H_2O$, 1% $NaH_2PO_2 \cdot H_2O$, 5% ammonium chloride, 10% sodium citrate, and 81% water (all percentages being by weight). To a hundred volumes of the foregoing solution, five volumes of ammonium hydroxide are added and the solution is heated to 95° C., at which time five more volumes of ammonium hydroxide are added. The item to be plated, for example, the semiconductor body 11 with its autogenously formed relatively metallic and conductive zone or region 17, is immersed in the solution, which is maintained at 95° C. Every six minutes, two volumes of ammonium hydroxide are added to replace loss. At the end of 30 minutes, the body 11 is removed and washed with water and alcohol and then air-dried. It is found that a layer of nickel has selectively plated to the exposed portions of the autogenously formed zone 17. The resulting nickel plated path is found to be extremely tightly bonded or adhered to the underlying zone 17.

The degree of exposure to a concentrated energy source may be varied as desired to vary the degree of change caused even in the extreme surface regions receiving the greatest amount of energy. By this technique, zones or regions may be formed having preselected conductivities, within certain ranges. By varying the degree of exposure while a pattern is traced upon a semiconductor body, by an electron beam or other concentrated energy source, it is thus possible to form a conductive path having variable degrees of conductivity. If desired, this technique may be utilized to define comparatively less conductive zones or regions which serve as resistors.

Figure 2:
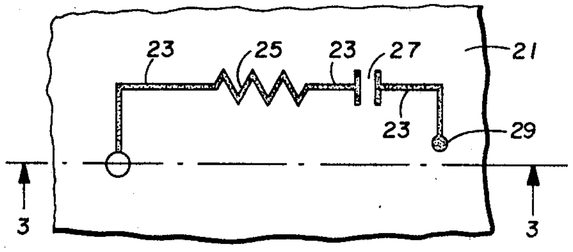
FIGURE 2 is a fragmentary plan view of a semiconductor solid circuit comprising a semiconductor body having a circuit portion, including a circuit path and passive components, formed thereon.
Figure 3:
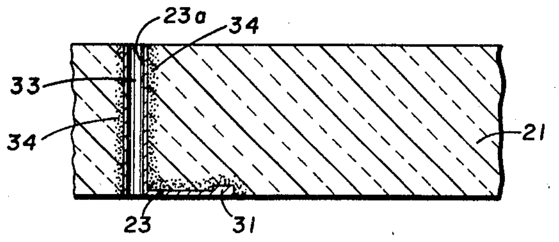
FIGURE 3 is a sectional view taken along 3—3 of FIGURE 2.

FIGURE 2 schematically illustrates a semiconductor body 21 which carries an autogenously formed circuit pattern. This circuit pattern includes the extremely low resistance conductive paths 23, a resistor 25 of relatively high resistance, and a capacitor 27. A portion of the circuit pattern is formed on an upper surface region of the body 21 and a portion on the lower surface region. A contact 29, generally circular in configuration, terminates the circuit pattern on the upper surface of body 21 and a contact 31, of similar configuration, terminates the circuit pattern on the lower surface. A hole 33 passes through the body and interconnects the upper and lower portions of the circuit pattern. The hole is formed by drilling with the concentrated energy source by which relatively metallic or conductive regions 34 are autogenously formed in accordance with the present invention, for example, by drilling with an electron beam. The surface regions of the hole 33 are preferably preferentially plated, as with nickel, to provide a highly conductive interconnection between the conductive paths 23 on the upper and lower surfaces of the body 21. Thus, as is illustrated in FIGURE 3, nickel layer 23*a* has been plated on the chemically altered surface regions of the hole 33 to form a part of the conductive path 23.

The conductive paths 23 are formed by the technique previously discussed herein in connection with FIGURE 1, i.e. by tracing with an electron beam followed by plating with suitable metal, for example, nickel. The capacitor 27 is formed by moving the beam to suitably define a capacitor plate, making a skip in the pattern, and then forming an oppositely disposed capacitor plate. The region in between the autogenously formed plates serves as the dielectric. In most cases it will be desired to deposit metal on the capacitor plate by electroless plating technique, for example, to deposit nickel. Accordingly, the capacitor regions may be selectively formed in the body 21 by an electron beam at the same tracing operation that the autogenously formed underlying regions for the circuit paths 23 are formed and that the hole 33, with its bounding relatively metallic, autogenously formed surface regions, is drilled. Similarly, the circular patterns of the contact regions 29 and 31 are formed during this same operation, in order that they may be simultaneously plated with the circuit paths and capacitor. A skip may be left for the resistor 25 during the first tracing operation and it may be formed after plating has been conducted on the other portions of the circuit pattern. Then the electron beam is impinged on the surface, to achieve a desired degree of exposure, in order to form the resistor 25 of desired resistance. Alternatively, the entire circuit pattern may be autogenously formed by an electron beam in a single tracing step. Thereafter the resistor 25 may be masked, as with epoxy resin, and the body 21 immersed in the plating solution. After plating is completed, a suitable solvent, e.g. acetone for epoxy, may be used to remove the masking material. By this means, all autogenously formed regions are plated except for the resistor 25, which was protected by masking during the plating operation.

The technique of the present invention makes it possible to form paths or regions on a semiconductor that are quite intricate in nature and that have a high degree of integrity of shape, compared to a predetermined desired configuration. For example, in gallium arsenide having a resistivity somewhat about $10^8$ ohm-cm., a line having one mil resolution may be cut by an electron beam. The depth of such a line may be made as little as approximately one mil. The resistance of such a 1 mil x 1 mil path in gallium arsenide is found to be approximately 50 ohms per cm.

With care, the localized alteration of chemical structure can be carried to an even higher degree of resolution by the combining of the concentrated energy source e.g. the electron beam, with an electrical-optical lens system. Thus, resolutions from one micron to 0.1 micron are obtainable. Accordingly, changes in semiconductor bodies can be made with high resolution in accordance with extremely minute, intricate and precise patterns in preselected regions.

A semiconductor body having relatively metallic or conductive zones thereon, for example, configured as various circuit paths and passive components, formed as described, may be joined to an insulating body, for example, a body made of yttrium iron garnet having autogenously formed circuit paths and passive components in accordance with a desired circuit pattern. The resulting integrated structure comprises a solid integrated circuit, all contained within the composite body. It will be apparent that the semiconductor material may possess regions of differing carrier characteristics, e.g. depending on degree of doping, to define transistors, diodes, etc. as may be required for a particular circuit. A composite body of the general nature referred to, but not having autogenously formed paths within the semiconductor portion of the body is described as claimed in copending U.S. patent application Ser. No. 398,480, entitled "Dielectric Bodies With Selectively Formed Conductive or Metallic Portions, Composites Thereof With Semiconductor Material, and Methods of Making Said Bodies and Composites," filed Sept. 18, 1964, assigned to the assignee of the present invention. Reference is made to the said copending application for all details regarding such a composite body, other than the feature of autogenously formed paths and components in the semiconductor portion. Suffice to say that the semiconductor portion of the body illustrated in said copending application might have such conductive paths or regions formed in it, in accordance with the present invention, as are desired for a particular solid integrated circuit.

Semiconductor compounds generally, either bulk or epitaxial, are applicable to autogenous formation of relatively metallic or conductive zones in accordance with the present invention. Accordingly, Group III–V, Group II–VI, Group I–VI, and Group I–VII semiconductor compounds, as well as rare earth semiconductor compounds, are included within the semiconductor materials applicable to the present invention. As specific examples, which are not intended to be taken as limiting, the following materials are applicable to the present invention: gallium arsenide, indium arsenide, aluminum phosphide, gallium phosphide, gallium antimonide, aluminum antimonide, gallium bismide (GaBi), indium antimonide, indium phosphide, zinc sulphide, mercurous sulphide, cuprous sulphide, cadmium sulphide, cadmium selenide, and cadmium telluride, and all possible mixtures of the foregoing compounds, e.g., GaAs-GaP, whether or not doped. Group III–V compounds and mixtures of Group III–V compounds, either with other Group III–V compounds or with elemental semiconductor material (e.g., silicon and germanium), whether or not doped, are particularly preferred. For example, gallium arsenide, gallium phosphide, gallium arsenide-gallium phosphide, gallium arsenide-silicon, gallium arsenide-germanium, and gallium arsenide-gallium phosphide-silicon, to name but a few, are preferred.

The following table presents the extent of resistivity change accomplished by electron beam exposure to a semiconductor body of the designated compound in a preselected region:

| Compound | Semiconductor body resistivity (ohm-cm.) | Resistivity of exposed region (ohm-cm.) |
|---|---|---|
| AlSb | 1 | 0.2 |
| GaAs* | $1\times10^8$ | 50 |
| GaAs | $1\times10^7$ | 60 |
| InSb | 30 | 20 |
| PbTe | 40 | 5 |

*Of very high purity.

Many compound semiconductors, to which the present invetnion is applicable, have relatively low resistivities or may be intrinsic at room temperature. Notwithstanding this initial condition, changes may still be produced by a concentrated energy source, e.g., an electron beam, such that a comparatively low resistance may be reduced to a substantially lower value, for example, reduced from 30 ohm-cm. to 15–20 ohm-cm. along a 1 mil path formed in indium antimonide. Thus, relatively conductive paths and passive devices may be provided in such semiconductor materials. The relatively conductive paths and device structure may be selectively plated by electroless plating technique.

The present invention provides a simplified means to join metal to semiconductor for various applications. For example, not only may metal be plated on a semiconductor, but it may be fused thereto on the relatively metallic regions formed by selective chemical structural alteration. A good bond, with the altered region as a transition joint, results. Thus, steel, kovar, nickel, etc. may be joined to a semiconductor compound body.

Summarizing some important method aspects of the present invention as illustrated and discussed in detail above, a planar zone which is comparatively conductive, particularly a planar conductive path, may be formed in surface regions of a semiconductor body by moving an electron beam or other concerted energy source relative to the body. The comparatively conductive zone is preferably thereafter plated. If the concentrated energy source is left fixed in one position, a comparatively conductive "hole," i.e., annular conductive region, may be drilled into a semiconductor body and thereafter plated to provide a means of interconnecting circuitry disposed at two or more distinct body levels.

The localized concentrated energy source used in the present invention is not limited to an electron beam system. A laser, arc, spark, or other concentrated energy source may be utilized; however, the electron beam is preferred. Preferably a vacuum environment, or at least inert environment, should be provided. Note that an electron beam system includes a vacuum environment, e.g., a vacuum of $10^{-5}$ mm. Hg.

In accordance with the foregoing, it has been seen that a body comprising a semiconductor portion having a comparatively conductive zone integral with and autogenously formed from the body is provided. The zone may include or be configured to provide a highly miniaturized ohmic contact. A method for making such structure is provided.

A relatively conductive or metallic zone in a semiconductor, autogenously formed by a preferably localized and concentrated energy source, has been seen to be an important feature of the present invention. Such relatively conductive or metallic zone may be metalized, if desired, either by alhering metal by plating or welding. Highly miniaturized ohmic contacts and circuit patterns for semiconductor bodies are made by such techniques.

As used herein, the term "semiconductor" refers to materials which range in resistivity, at room temperature, from $10^{-2}$ to $10^{9}$ ohm-cm. and in which the electrical charge carrier concentration increases with increasing temperature over some temperature range.

The present invention is applicable to semiconductor bodies of either mono or polycrystalline structure, although it is preferred for monocrystalline structure.

What is claimed is:

1. The process of preparing a comparatively planar, conductive zone on an exposed surface of a semiconductor body made of a semiconductor compound composed of at least two elements one of which is more volatile than the other comprising in a nonreducing ambient applying along the zone to be rendered comparatively conductive localized, concentrated energy of sufficient intensity and for a sufficient time to effect removal of the more volatile element from said compound and selectively alter the chemical structure of said zone of said semiconductor body contiguous with said exposed surface whereby said zone is made comparatively conductive.

2. The process of preparing a comparatively conductive zone of a predetermined pattern on a body made of a semiconductor compound composed of at least two chemical elements, one of the elements being a more volatile element than the other, comprising in the absence of a reducing agent, locally and preferentially impinging on the surface of said body along said predetermined pattern an electron beam of sufficient intensity and for a sufficient period of time to effect removal of the more volatile element and alter the chemical structure of said semiconductor compound along said predetermined pattern, and varying the electron beam to produce a change in the amount of concentrated energy reaching said body in the course of forming said pattern.

3. The process of claim 2 in which said semiconductor compound is gallium arsenide.

4. The process of claim 2 in which said semiconductor compound is aluminum antimonide.

5. The process of claim 2 in which said semiconductor compound is indium antimonide.

6. The process of claim 2 in which said semiconductor compound is lead telluride.

7. The process of claim 2 in which said semiconductor compound is gallium phosphide.

8. The process of claim 2 further comprising the step of adhering a metal of either nickel, copper, cobalt, or a mixture thereof to said path by electroless plating.

9. The process of claim 2 wherein said pattern includes a path running essentially parallel to said surface.

10. The process of preparing a circuit path on a semiconductor body of a compound of at least two chemical elements, one of which is a more volatile element than the other, comprising:

in the absence of a reducing agent, impinging an electron beam of sufficient intensity on said body in regions corresponding to a desired circuit pattern for a time sufficient to effect removal of the more volatile element to alter the chemical structure in said regions;

varying said electron beam to produce a change in the amount of concentrated energy reaching said regions in the course of forming said pattern; and adhering a metal of either nickel, copper, cobalt, or a mixture thereof to said region.

11. The process of claim 10 wherein said metal is adhered to said regions by electroless plating.

12. A body comprising a semiconductor portion consisting essentially of a semiconductor compound composed of at least two chemical elements, one of which is a more volatile element and one of which is a less volatile element, said less volatile element being more electrically conductive than said semiconductor compound, said body having a comparatively conductive zone, including a planar path of altered chemical structure being enriched in the less volatile element extending along a surface of the body, integral with and autogenously formed therein by having effected removal of said more volatile element in the absence of a reducing agent through application of a localized, concentrated energy to a part only of said semiconductor portion.

13. The body of claim 12 in which said semiconductor compound is gallium arsenide.

14. The body of claim 12 in which said semiconductor compound is aluminum antimonide.

15. The body of claim 12 in which said semiconductor compound is indium antimonide.

16. The body of claim 12 in which said semiconductor compound is lead telluride.

17. The body of claim 12 in which said semiconductor compound is gallium phosphide.

18. The body of claim 12 in which said comparatively conductive zone has variable degrees of conductivity, in accordance with a desired pattern of variations.

19. The body of claim 12 wherein said path comprises a segment that is comparatively less conductive than other portions of the path, whereby said segment defines a resistor on said conductive path.

20. The body of claim 12 wherein said path includes two spaced apart conductive zones whereby a capacitor is defined on said semiconductor body with the two zones as plates.

21. The body of claim 12 in which a metal of either nickel, copper, cobalt, or a mixture thereof is adhered to said zone.

22. The body of claim 21 in which said metal is plated to said zone.

23. The body of claim 22 in which said metal is nickel.

24. The body of claim 21 in which said metal comprises at least a major proportion of nickel.

References Cited

UNITED STATES PATENTS

| | | | |
|---|---|---|---|
| 3,056,881 | 10/1962 | Schwarz | 117—212 |
| 3,323,198 | 6/1967 | Shortes | 29—155.5 |

FOREIGN PATENTS

| | | |
|---|---|---|
| 847,927 | 9/1960 | Great Britain. |
| 1,011,528 | 7/1957 | Germany. |

ALFRED L. LEAVITT, Primary Examiner

A. M. GRIMALDI, Assistant Examiner

U.S. Cl. X.R.

29—582, 624; 117—93.3, 217; 317—101